United States Patent
Hagino et al.

(10) Patent No.: US 6,797,651 B2
(45) Date of Patent: Sep. 28, 2004

(54) METHOD FOR MANUFACTURING POLYCRYSTALLINE SEMICONDUCTOR LAYERS AND THIN-FILM TRANSISTORS AND LASER ANNEALING APPARATUS

(75) Inventors: Takashi Hagino, Gifu (JP); Kazuhiro Imao, Gifu (JP); Ken Wakita, Gifu (JP); Toshio Monzen, Gifu (JP); Hidenori Ogata, Gifu (JP); Shiro Nakanishi, Gifu (JP); Yoshihiro Morimoto, Aichi (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/080,424

(22) Filed: Feb. 22, 2002

(65) Prior Publication Data

US 2002/0142567 A1 Oct. 3, 2002

(30) Foreign Application Priority Data

Feb. 22, 2001 (JP) ........................................ 2001-047181

(51) Int. Cl.[7] ............................................... H01L 21/26
(52) U.S. Cl. ...................................................... 438/798
(58) Field of Search ................................... 438/798, 155

(56) References Cited

U.S. PATENT DOCUMENTS 5,313,076 A * 5/1994 Yamazaki et al. ............. 257/66

* cited by examiner

Primary Examiner—W. David Coleman
(74) Attorney, Agent, or Firm—Cantor Colburn LLP

(57) ABSTRACT

A laser annealing apparatus is provided in which laser light is irradiated onto an amorphous semiconductor layer placed inside an annealing chamber through a chamber window, thereby poly-crystallizing the amorphous semiconductor film. Inside the annealing chamber a low degree vacuum (about $1.3 \times 10^3$ Pa to about 1.3 Pa) is maintained at a room temperature. An inert gas such as nitrogen, hydrogen, or argon is introduced into the atmosphere while maintaining the low degree vacuum. As a result, the surface smoothness of the polycrystalline semiconductor layer is comparable to that resulting from high degree vacuum annealing, while, unlike high degree vacuum annealing, there is less contamination of the chamber window and productivity is improved.

11 Claims, 5 Drawing Sheets

METHOD FOR MANUFACTURING POLYCRYSTALLINE SEMICONDUCTOR LAYERS AND THIN-FILM TRANSISTORS AND LASER ANNEALING APPARATUS

BACKGROUND OF THE INVENTION

1. Field of the Invention

The present invention relates to a process of poly-crystallizing amorphous semiconductor layers using laser annealing.

2. Description of the Related Art

Thin-film transistors (hereinafter referred to as TFTs), in which polycrystalline silicon (p-Si) is used as an active layer, have a higher switching capability than do TFTs in which amorphous silicon (a-Si) is used. Moreover, thin-film transistors are characterized in that, because the channel position in an active layer is determined through self alignment, elements can be miniaturized and converted into a CMOS (complementary MOS) structure. For that reason, thin-film transistors are used as pixel switching elements and drivers for active-matrix-type flat panel displays, e.g. liquid crystal displays.

A polycrystalline silicon film can be formed through heating and poly-crystallizing an amorphous silicon film. However, a low-melting point glass substrate is often used as a silicon film forming substrate because an inexpensive and large-sized substrate can be easily fabricated. In addition to the solid phase growing method, the rapid-thermal-lamp annealing (RTA) and the laser annealing have been proposed as poly-crystallizing methods. For a low-melting point of the glass substrate in particular, a low-temperature processable laser annealing is considered effective for poly-crystallizing annealing.

In the laser annealing shown in FIG. 1, an object 200 to be processed is placed in the annealing chamber 100 and an external light source irradiates focused laser light (Excimer laser) onto the object through the window (process window) 120. A nitrogen atmosphere at a normal pressure used as an annealing process atmosphere can provide high throughput and good productivity in the annealing process. Therefore, the poly-crystallization laser annealing in a nitrogen atmosphere under normal pressure has been employed to mass produce polycrystalline silicon layers.

The process atmosphere in the chamber during annealing is one important factor influencing the surface roughness and crystallizability of a p-Si. Excimer laser annealing in a nitrogen atmosphere under normal pressure can realize a high productivity of a polycrystalline silicon film. However, research of the present applicant demonstrated that it is difficult to control the surface roughness of a p-Si manufactured in the nitrogen atmosphere under the normal pressure, and that under such conditions the Si surface tends to be rough. In order to prevent formation of rough surfaces, annealing is continued while the chamber 100 is evacuated using the extraction pump 300 as shown in FIG. 1.

However, it has been revealed that performing Excimer laser annealing in the vacuum atmosphere leads to contaminating inside of the process window of the annealing chamber. Because the contamination rate is very swift, the cycle between contamination removal is very short. As a result, it has been difficult to employ the above-mentioned vacuum conditions in mass production poly-crystallization laser annealing apparatuses.

SUMMARY OF THE INVENTION

The present invention is made to overcome the above-described problems. It is an object of the present invention to provide a laser annealing method of forming a polycrystalline semiconductor film with smooth surfaces. This method is suitable for mass production, with less contamination of the process window.

In order to accomplish this object, a method for manufacturing a polycrystalline semiconductor device comprises a step of laser annealing an amorphous semiconductor layer in a low degree vacuum atmosphere.

In another aspect of the present invention, a method of manufacturing a thin-film transistor comprises the steps of forming an amorphous silicon layer on a substrate; disposing the substrate on an annealing chamber; creating a low degree vacuum atmosphere within said annealing chamber; and irradiating focused laser light onto the amorphous silicon layer overlying the substrate through a chamber window built in the annealing chamber to anneal and poly-crystallize the amorphous silicon, whereby a polycrystalline silicon layer is formed as an active layer of the thin-film transistor.

In another aspect of the present invention, the annealing is performed under a pressure between about $1.3 \times 10^3$ Pa and about 1.3 Pa.

In another aspect of the present invention, the annealing is performed in an annealing atmosphere containing an inert gas.

As described above, the polycrystalline semiconductor layer, e.g. polycrystalline silicon layer, formed through the laser annealing in a nitrogen atmosphere under a normal pressure (atmospheric pressure) is relatively very rough. The following is considered as one of causes. It can be considered that this reduction in flatness is caused by formation of nitrogen reaction film on the surface of the amorphous semiconductor layer due to the presence of nitrogen in the annealing atmosphere. In contrast, laser annealing under high degree vacuum condition does not lead to formation of reacted products on the film surface, and a polycrystalline semiconductor layer with a smooth surface can be formed. However, the vacuum created inside the annealing chamber causes an increase in the mean free path of gas molecules, with the result that, during the laser annealing, particles sputtered around a semiconductor layer placed in the chamber will travel to and deposit onto the chamber window, thus contaminating it.

In the present invention, by conducting laser annealing under a relatively low pressure, for example, ranging from about $1.3 \times 10^3$ Pa to about 1.3 Pa, formation of reactive products on the surface of an amorphous semiconductor layer can be prevented. As a result, a polycrystalline semiconductor layer having high surface smoothness can be manufactured. Moreover, since the mean free path of molecules can be reduced compared with vacuum (high degree vacuum) conditions, the contamination rate of the chamber window can be sufficiently reduced. As a result, a polycrystalline semiconductor layer with uniform grain diameter and with flat surface can be manufactured with high productivity. The polycrystalline silicon layer thus obtained can be used as an active layer of a thin-film transistor. For example, in the top gate-type thin film transistor, the gate electrode can be formed above the polycrystalline silicon active film with high smoothness. The electrical and structural process margin can be sufficiently secured. Thus, transistors with high reliability can be manufactured.

In another aspect of the present invention, a laser annealing apparatus, wherein focused laser light is irradiated through a chamber window onto an object to be processed placed inside an annealing chamber, comprises an introducer for introducing an inert gas into the annealing chamber during annealing; a pump for reducing the pressure in the annealing chamber; and a pressure controller for controlling the pressure in said annealing chamber to a pressure between about $1.3 \times 10^3$ Pa and about 1.3 Pa.

In the above-mentioned apparatus structure, a polycrystalline semiconductor layer with high surface smoothness can be effectively manufactured in the annealing chamber.

As described above, according to the present invention, stable polycrystalline semiconductor layers with high smoothness can be manufactured with high productivity through low degree vacuum laser annealing.

BRIEF DESCRIPTION OF THE DRAWINGS

These and other objects, features, and advantages of the present invention will become more apparent from the following detailed description taken in conjunction with the attached drawings, in which.

DESCRIPTION OF THE EMBODIMENT

A preferred embodiment of the present invention will be described below while referring to the attached drawings.

Figure 1:
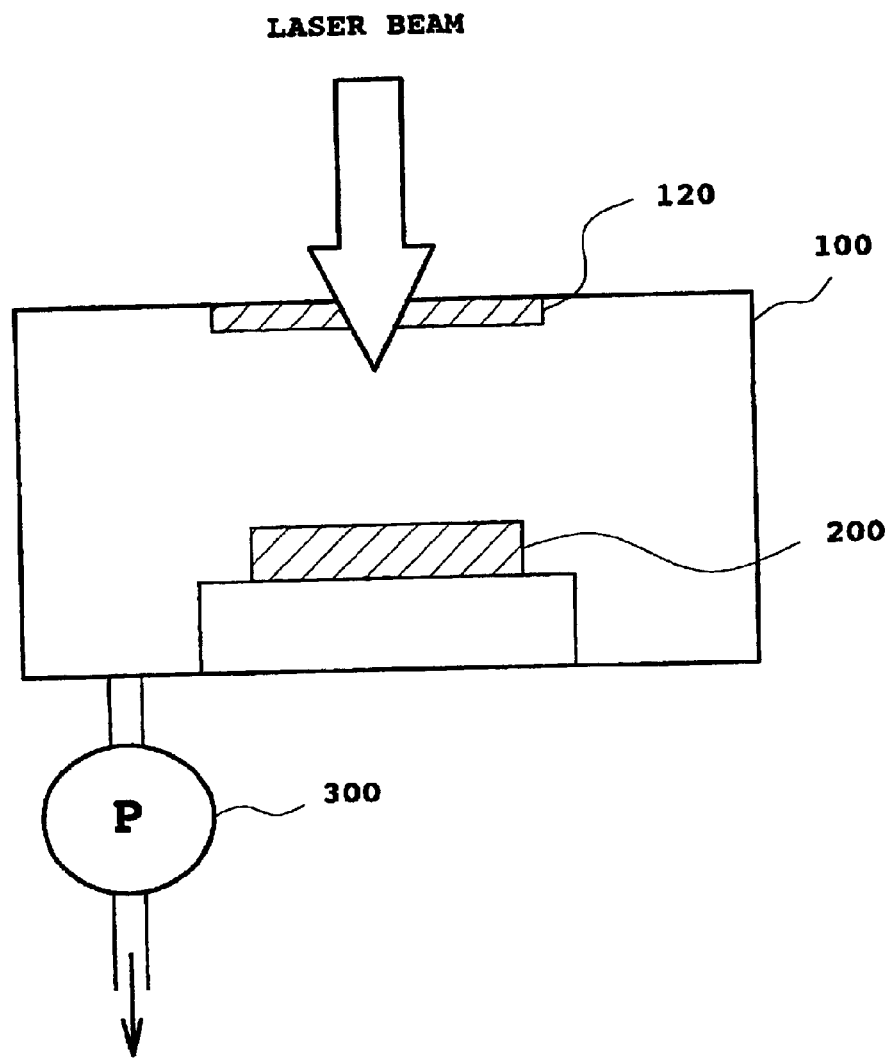
FIG. 1 is a diagram illustrating the configuration of a conventional laser annealing apparatus.
Figure 2:
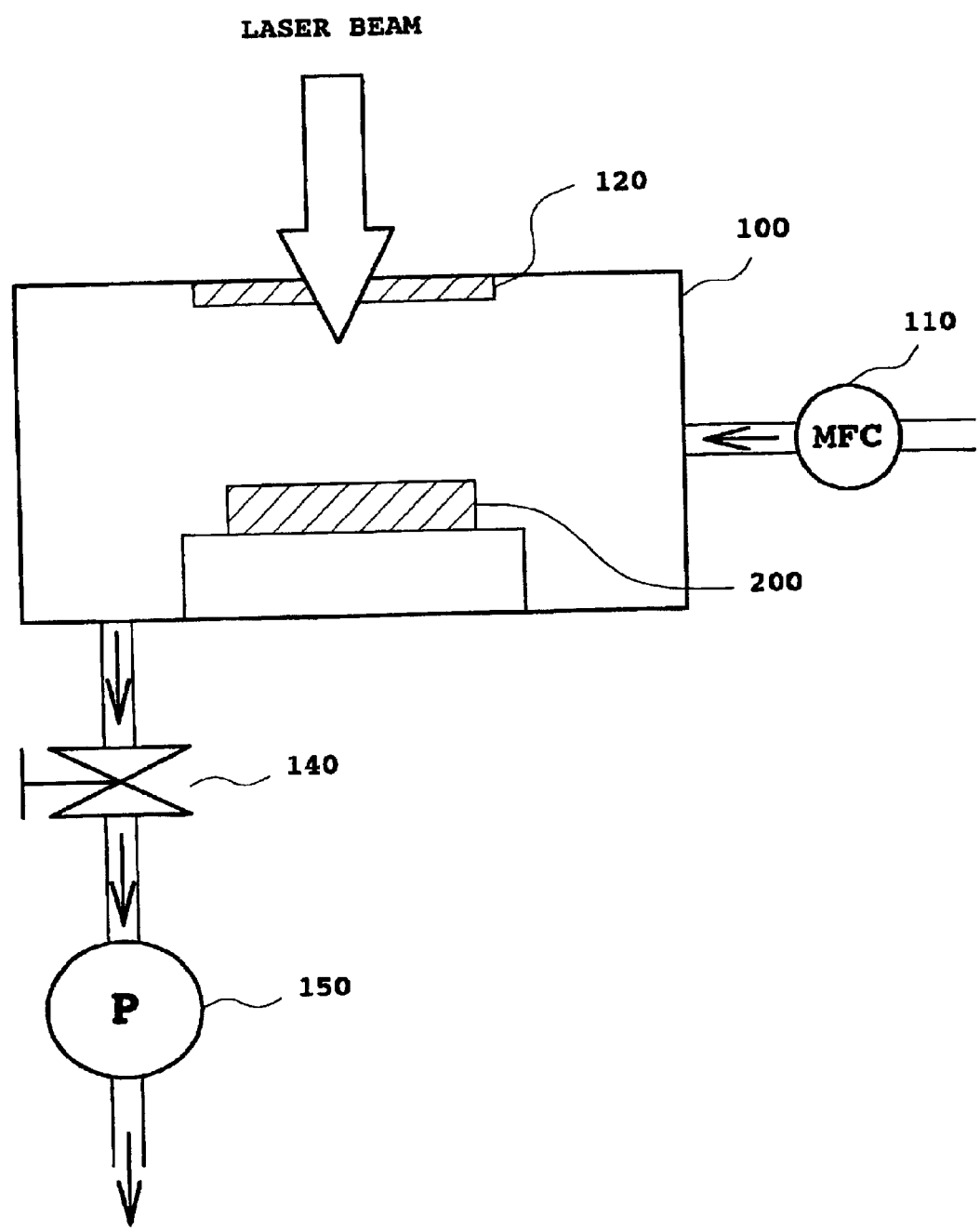
FIG. 2 is a schematic diagram illustrating the configuration of a laser annealing apparatus according to an embodiment of the present invention.

FIG. 2 shows the schematic configuration of a laser annealing apparatus according to the present invention. This apparatus has an annealing chamber 100 in which the substrate 200 on which an amorphous semiconductor (a-Si) film to be processed is formed is placed. A transparent process window (chamber window) 120 of quartz is provided for the chamber 100. The Excimer laser source (e.g. XeCl) (not shown) irradiates pulse laser beams onto the amorphous semiconductor film inside the chamber 100 from the window 120 through the predetermined optical system.

A mass flow controller 110 is coupled to the annealing chamber 100 and introduces an inert gas (to be described later) into the chamber 100 over controlling the gas flow (mass). An evacuation pump 150 is coupled to the chamber 100. A pressure control valve (conductance valve) 140 is inserted between the evacuation pump 150 and the chamber 100 to control the evacuation amount, or the vacuum degree, of the chamber 100. In the example of this embodiment, the pump 150 first evacuates the chamber 100 to a high degree vacuum state, and then the pressure control valve 140 is adjusted to introduce a predetermined inert gas into the chamber 100 using the mass flow controller 110. In this manner, the pressure in the chamber 100 during laser annealing can be maintained at a low degree vacuum state (about $1.3 \times 10^3$ Pa to about 1.3 Pa). The process temperature is set to the room temperature.

Inert gases such as $N_2$, $H_2$, Ar, and Ne can be used as an inert gas to be introduced into the chamber 100 via the mass flow controller 110. These inert gases do not form an oxide film on the surface of a semiconductor film through the chemical reaction during laser annealing an amorphous semiconductor film. In the example of this embodiment, $N_2$ is employed.

Figure 3:
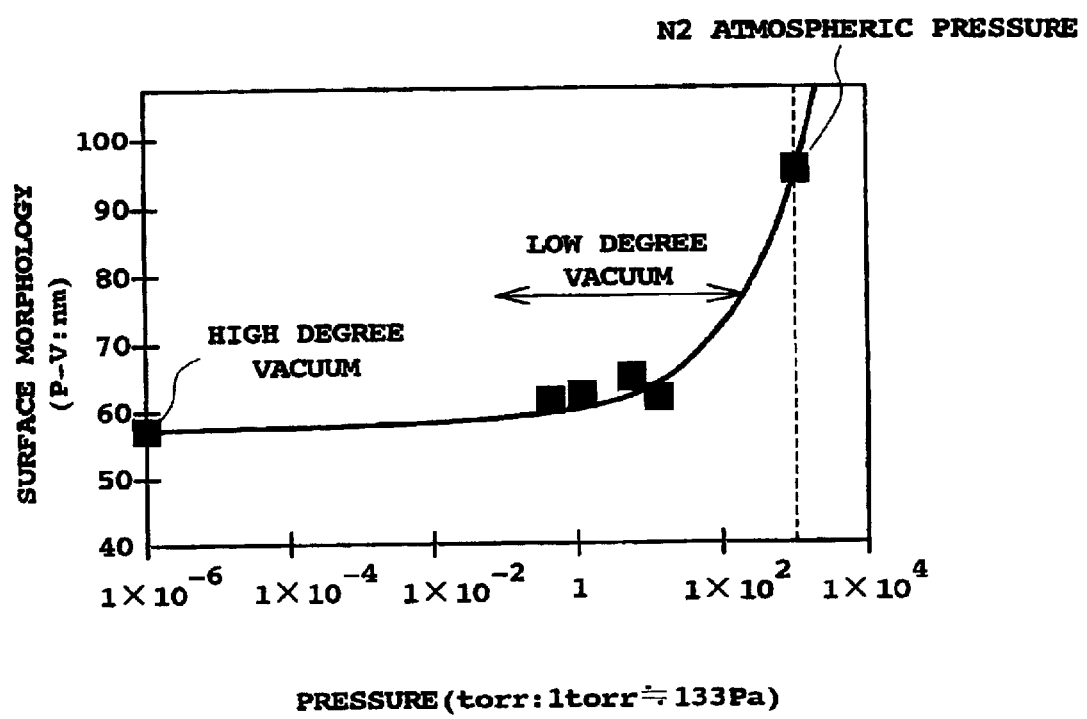
FIG. 3 is a diagram showing a relationship between pressure condition in laser annealing and surface roughness of a resultant p-Si film.
Figure 5:
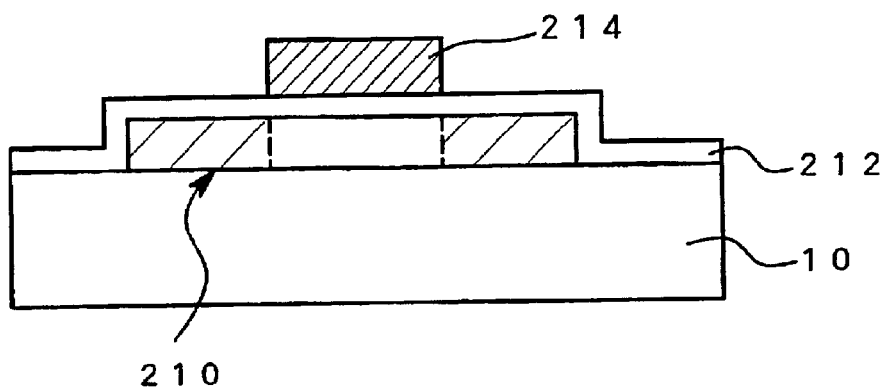
FIG. 5 is a cross-sectional view schematically illustrating a top-gate type thin-film transistor in which a polycrystalline silicon obtained by the present invention is used as an active layer.

FIG. 3 shows the relationship between pressure conditions (horizontal axis) and laser annealing and surface roughness (vertical axis) of a resultant polycrystalline silicon film. The surface roughness (in nm) is characterized by the peak to valley, that is, the distance between a protruded surface and the lower surface of a film, measured using an atom force microscope (AFM). The value of the surface roughness includes an amount of protrusion from a film surface as well as a film thickness. Referring to FIG. 3, the P-Si film, which is prepared through an Excimer laser annealing under a nitrogen atmosphere (760 torr) at a normal (room) temperature, has a roughness of 90 nm to 100 nm with respect to a film thickness of 45 nm. In other words, it is understood that the p-Si film has a rough surface of which the roughness varies twice with respect to the film thickness. The p-Si film can be used as an active layer of a thin-film transistor. However, in a top gate-type transistor as shown in FIG. 5, the active layers 210 of the p-Si film are formed on the substrate 10. An insulating film 212 is formed on the active layers 210. A gate electrode 214 is formed on the gate insulating film 212 so as to sandwich the gate insulating film 212 between the gate electrode 214 and the active layers 210. With this fabrication, when the surface of the active layer 210 is very rough, the gate electrode 214 cannot be accurately formed on the gate insulating film above the active layer 210. As a result, the characteristics of the transistor may vary, which may lead to contact failure and disconnection.

In contrast, according to the present embodiment, the surface roughness of a p-Si film laser-annealed in a nitrogen atmosphere of a low degree vacuum degree (of about $1.3 \times 10^3$ Pa to about 1.3 Pa) and at a room temperature is approximately 60 nm as shown in FIG. 3. The surface roughness is equal to the roughness of the p-Si film polycrystallized in the high degree vacuum condition ($1 \times 10^{-6}$ torr in FIG. 3). In other words, the smoothness of the film is greatly improved. For that reason, when the p-Si film is used as the active layers 210 of the top gate-type thin film transistor as shown in FIG. 5, the electrical and structural process margins can be sufficiently secured.

Figure 6:
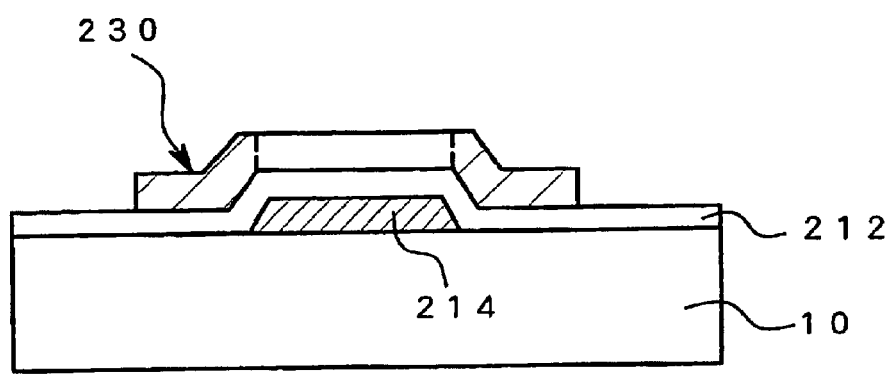
FIG. 6 is a cross-sectional view schematically illustrating a bottom-gate type thin-film transistor wherein a polycrystalline silicon obtained by the present invention is used as an active layer.

Similarly, when the p-Si film is used as an active layer of the bottom gate-type thin film transistor as shown in FIG. 6, adequate electrical and structural process margins can be secured.

Figure 4:
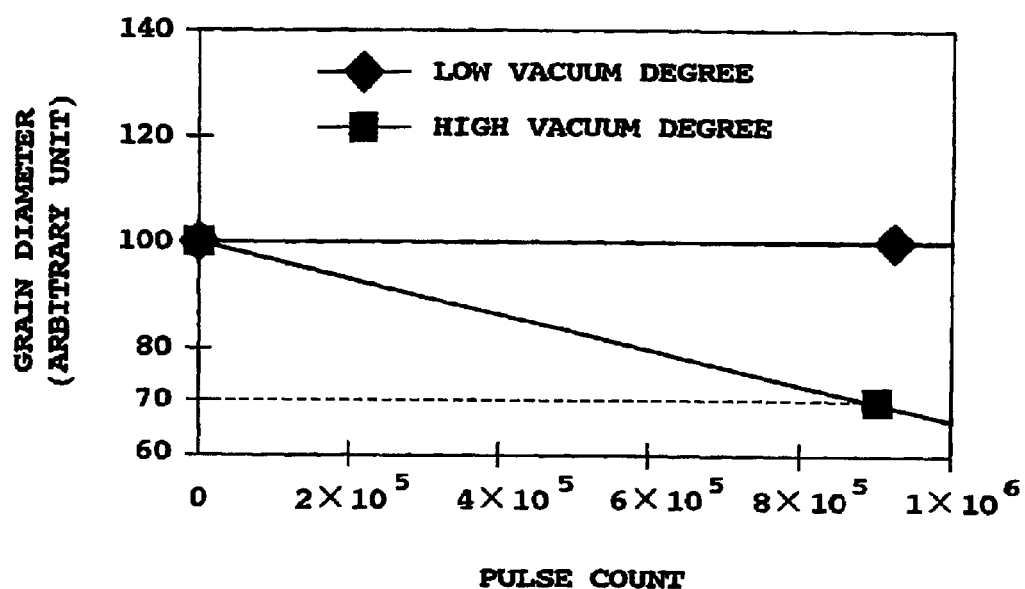
FIG. 4 is a diagram showing a relationship between laser pulse count and grain diameter of a p-Si film.

FIG. 4 shows the relationship between the pulsed Excimer laser beam pulse count in the laser annealing apparatus and the grain diameter (in given units) of a resulting p-Si film. Referring to FIG. 4, an Excimer laser beam excited in XeCl having a laser power ranging from 300 to 350 $mJ/cm^2$ was used for the laser source. During the laser annealing, an optical system was used to focus the laser light into a predetermined rectangular form. The laser light was scanned over the irradiation area while being shifted by a predetermined distance (e.g. 5 $\mu$m to 20 $\mu$m) from the previously irradiated area. The laser beam was irradiated onto the amorphous silicon film while changing the irradiation position for each pulse.

Referring to FIG. 4, under a high degree vacuum condition which can preferably produce a flat film, the initially formed p-Si film had a large grain size. In FIG. 4, the corresponding size is 100. However, as the total pulse count of the Excimer laser beam increased, the grain size of the p-Si film decreased. When the total pulse count reached about $9\times10^5$, the grain size of the resultant p-Si film was 70% of the grain size in the initial state. Because the grain size of the p-Si film largely affects the characteristics of the thin film transistor, variations in grain size are not permissible.

An increase in pulse count causes contamination of the chamber window 120 in the annealing chamber 100, which in turn causes a decrease in grain size of the p-Si film. Thus, the laser transmittance is decreased and the laser beam energy supplied to the amorphous silicon film decreases. However, even when the contamination of the window 120 decreases transmittance by only 4 to 5%, the grain size of the p-Si film is adversely affected to a great extent. In the high degree vacuum annealing under the high degree vacuum condition ($1.3\times10^{-3}$ Pa: $1\times10^{-5}$ torr), the window 120 is remarkably contaminated by repeating the annealing, that is, pulse irradiation $3\times10^5$ times. Hence, when the annealing under high degree vacuum condition is continued for a day, the window 120 has to be cleaned several ten times per day (this process depends on the irradiation power). Hence, it is very difficult to employ the high degree vacuum conditions in the laser annealing apparatus for mass production of the p-Si film.

In contrast, according to the present invention, the laser annealing is performed under low degree vacuum conditions (in the example, $1.3\times10^{-3}$ Pa: 10 torr). The grain size of the p-si film obtained with a pulse count of $9\times10^5$ as shown in FIG. 4 was substantially equal to the initially obtained grain size. It is assumed that fewer contaminants adhere to the window 120 because the mean free path of molecules under the low degree vacuum conditions decreases because of the presence of the inert gas existing in the chamber 100. The low degree vacuum laser annealing enables reduction of the cleaning frequency of the window 120 to about once per day, or even once per week. Thus, polycrystalline film with uniform grain size and with higher smoothness can be formed without decreasing the productivity.

What is claimed is:

1. A method for manufacturing a polycrystalline semiconductor layer, comprising the step of laser annealing an amorphous semiconductor layer atmosphere, the laser annealing is performed under a low degree vacuum atmosphere with a pressure equal to or higher than about 1.3 Pa.

2. The method defined in claim 1, wherein said annealing is performed under a pressure equal to or lower than about $1.3\times10^3$ Pa.

3. The method defined in claim 2, wherein said annealing is performed in an annealing atmosphere containing an inert gas.

4. The method defined in claim 3, wherein said inert gas includes a gas selected from the group consisting of nitrogen, argon, and neon.

5. A method of manufacturing a thin-film transistor, comprising the steps of:

forming an amorphous silicon layer on a substrate;

disposing said substrate inside an annealing chamber;

creating a low degree vacuum atmosphere within said annealing chamber, the low degree vacuum atmosphere has a pressure equal or higher than about 1.3 Pa; and irradiating focused laser light onto the amorphous silicon layer overlying said substrate through a chamber window built in said annealing chamber to anneal and poly-crystallize said amorphous silicon, whereby a polycrystalline silicon layer is formed as an active layer of said thin-film transistor.

6. The method defined in claim 5, wherein said annealing is performed under a pressure equal to or lower than about $1.3\times10^3$ Pa.

7. The method defined in claim 5, wherein said annealing is performed in an annealing atmosphere containing an inert gas.

8. The method defined in claim 7, wherein said inert gas includes a gas selected from the group consisting of nitrogen, argon, and neon.

9. A laser annealing apparatus, wherein focused laser light is irradiated through a chamber window onto an object to be processed placed inside a annealing chamber, comprising:

an introducer for introducing an inert gas into said annealing chamber during annealing;

a pump for reducing the pressure in said annealing chamber; and a pressure controller for controlling the pressure in said annealing chamber to maintain a pressure between about $1.3\times10^3$ Pa and about 1.3 Pa.

10. The method defined in claim 1, wherein said annealing is performed in an annealing atmosphere containing a hydrogen gas.

11. The method defined in claim 5, wherein said annealing is performed in an annealing atmosphere containing a hydrogen gas.

* * * * *